(12) United States Patent
Watkins et al.

(10) Patent No.: US 7,115,961 B2
(45) Date of Patent: Oct. 3, 2006

(54) PACKAGED MICROELECTRONIC IMAGING DEVICES AND METHODS OF PACKAGING MICROELECTRONIC IMAGING DEVICES

(75) Inventors: Charles M. Watkins, Eagle, ID (US); David R. Hembree, Boise, ID (US); Peter A. Benson, Guilderland, NY (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/925,502

(22) Filed: Aug. 24, 2004

(65) Prior Publication Data

US 2006/0043509 A1    Mar. 2, 2006

(51) Int. Cl.
*H01L 31/203*    (2006.01)

(52) U.S. Cl. ...................... 257/433; 257/432

(58) Field of Classification Search ................ 257/81, 257/432, 433, 434, 704
See application file for complete search history.

(56) References Cited

U.S. PATENT DOCUMENTS

| | | | |
|---|---|---|---|
| 3,345,134 | A | 10/1967 | Heymer et al. |
| 4,534,100 | A | 8/1985 | Lane |
| 4,906,314 | A | 3/1990 | Farnworth et al. |
| 5,130,783 | A | 7/1992 | McLellan |
| 5,371,397 | A | 12/1994 | Maegawa et al. |
| 5,424,573 | A | 6/1995 | Kato et al. |
| 5,435,887 | A | 7/1995 | Rothschild et al. |
| 5,505,804 | A | 4/1996 | Mizuguchi et al. |
| 5,593,913 | A | 1/1997 | Aoki |
| 5,605,783 | A | 2/1997 | Revelli et al. |
| 5,672,519 | A | 9/1997 | Song et al. |
| 5,694,246 | A | 12/1997 | Aoyama et al. |
| 5,708,293 | A | 1/1998 | Ochi et al. |
| 5,771,158 | A | 6/1998 | Yamagishi et al. |
| 5,776,824 | A | 7/1998 | Farnworth et al. |
| 5,811,799 | A | 9/1998 | Wu |
| 5,821,532 | A | 10/1998 | Beaman et al. |
| 5,857,963 | A | 1/1999 | Pelchy et al. |
| 5,861,654 | A | 1/1999 | Johnson |
| 5,877,040 | A | 3/1999 | Park et al. |
| 5,897,338 | A | 4/1999 | Kaldenberg |
| 5,914,488 | A | 6/1999 | Sone |
| 5,977,535 | A | 11/1999 | Rostoker |
| 5,998,862 | A | 12/1999 | Yamanaka |
| 6,080,291 | A | 6/2000 | Woodruff et al. |
| 6,104,086 | A | 8/2000 | Ichikawa et al. |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—S. V. Clark
(74) *Attorney, Agent, or Firm*—Dickstein Shapiro LLP (57) ABSTRACT

Microelectronic imaging devices and methods of packaging microelectronic imaging devices are disclosed herein. In one embodiment, a microelectronic imaging device includes a microelectronic die having an integrated circuit, an image sensor electrically coupled to the integrated circuit, and a plurality of bond-pads electrically coupled to the integrated circuit. The imaging device further includes a cover over the image sensor and a plurality of interconnects in and/or on the cover that are electrically coupled to corresponding bond-pads of the die. The interconnects provide external electrical contacts for the bond-pads of the die. The interconnects can extend through the cover or along a surface of the cover.

44 Claims, 9 Drawing Sheets

U.S. PATENT DOCUMENTS

| | | | |
|---|---|---|---|
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B1 | 4/2002 | Bessho et al. | |
| 6,407,381 B1 | 6/2002 | Glenn et al. | |
| 6,411,439 B1 | 6/2002 | Nishikawa | |
| 6,483,652 B1 | 11/2002 | Nakamura | |
| 6,492,699 B1 * | 12/2002 | Glenn et al. | 257/433 |
| 6,503,780 B1 | 1/2003 | Glenn et al. | |
| 6,512,219 B1 * | 1/2003 | Webster et al. | 250/208.1 |
| 6,515,269 B1 * | 2/2003 | Webster et al. | 250/208.1 |
| 6,541,762 B1 | 4/2003 | Knag et al. | |
| 6,560,047 B1 | 5/2003 | Choi et al. | |
| 6,566,745 B1 | 5/2003 | Beyne et al. | |
| 6,603,183 B1 | 8/2003 | Hoffman | |
| 6,617,623 B1 | 9/2003 | Rhodes | |
| 6,661,047 B1 | 12/2003 | Rhodes | |
| 6,667,551 B1 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B1 | 3/2004 | Mashino et al. | |
| 6,864,172 B1 | 4/2004 | Noma et al. | |
| 6,734,419 B1 | 5/2004 | Glenn et al. | |
| 6,759,266 B1 | 7/2004 | Hoffman | |
| 6,774,486 B1 | 8/2004 | Kinsman | |
| 6,778,046 B1 | 8/2004 | Stafford et al. | |
| 6,791,076 B1 | 9/2004 | Webster | |
| 6,795,120 B1 | 9/2004 | Takagi et al. | |
| 6,797,616 B1 | 9/2004 | Kinsman | |
| 6,800,943 B1 | 10/2004 | Adachi | |
| 6,813,154 B1 | 11/2004 | Diaz et al. | |
| 6,825,458 B1 | 11/2004 | Moess et al. | |
| 6,828,663 B1 | 12/2004 | Chen et al. | |
| 6,828,674 B1 | 12/2004 | Karpman | |
| 6,844,978 B1 | 1/2005 | Harden et al. | |
| 6,882,021 B1 | 4/2005 | Boon et al. | |
| 6,885,107 B1 | 4/2005 | Kinsman | |
| 6,934,065 B1 | 8/2005 | Kinsman | |
| 6,946,325 B1 | 9/2005 | Yean et al. | |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0067681 A1 * | 3/2005 | De Villeneuve et al. | 257/678 |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0184219 A1 * | 8/2005 | Kirby | 250/208.1 |
| 2005/0236708 A1 | 10/2005 | Farnworth et al. | |
| 2005/0254133 A1 | 11/2005 | Akram et al. | |

FOREIGN PATENT DOCUMENTS

| | | | |
|---|---|---|---|
| EP | 1 157 967 A2 | 11/2001 | |
| FR | 2 835 654 A1 | 8/2003 | |
| JP | 59-101882 A | 6/1984 | |
| JP | 59-191388 | 10/1984 | |
| JP | 07-263607 A | 10/1995 | |
| JP | 2001-077496 A | 3/2001 | |
| WO | WO-90/05424 A1 | 5/1990 | |
| WO | WO-02/075815 A1 | 9/2002 | |
| WO | WO-02/095796 A2 | 11/2002 | |
| WO | WO-2004/054001 A2 | 6/2004 | |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microplithography 2002, Mar. 3-8, 2002, Santa Clara, CA.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.
DuPont Electronic Materials, Pyralux PC 2000 Flexible Composites, 4 pages, Oct. 1998, <http://www.dupont.com/fcm>.
Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Meterials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005 <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

PACKAGED MICROELECTRONIC IMAGING DEVICES AND METHODS OF PACKAGING MICROELECTRONIC IMAGING DEVICES

TECHNICAL FIELD

The present invention is related to microelectronic devices and methods for packaging microelectronic devices. Several aspects of the present invention are directed toward packaging microelectronic imaging devices that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, incorporate microelectronic imagers for capturing and sending digital images. The use of microelectronic imagers in electronic devices has been steadily increasing as imagers become smaller and produce higher quality images with increased pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also becoming very popular because they have low production costs, high yields, and small sizes. CMOS image sensors provide these advantages because they are manufactured using technology and equipment developed for fabricating semiconductor devices. CMOS image sensors, as well as CCD image sensors, are accordingly "packaged" to protect their delicate components and provide external electrical contacts.

Figure 1:
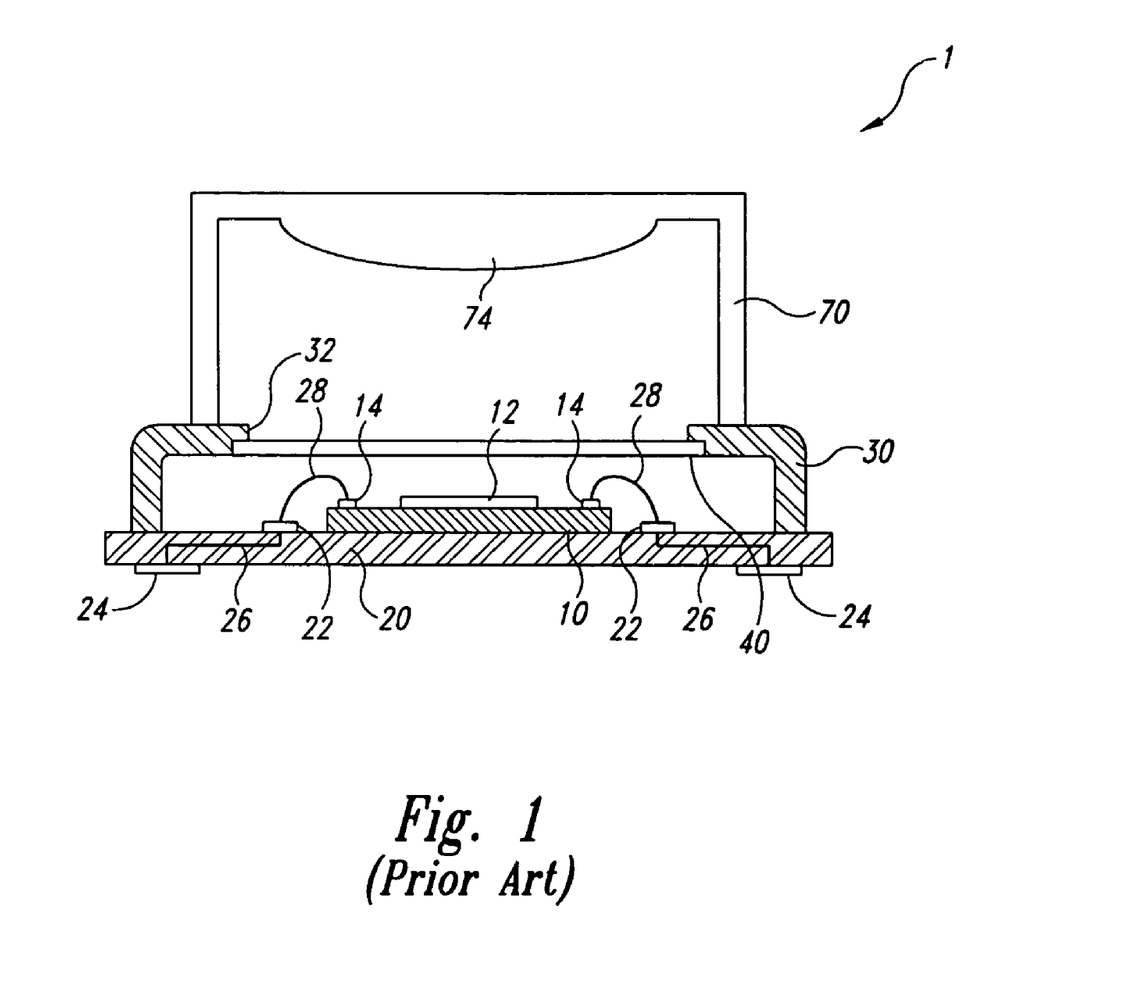
FIG. 1 is a schematic side cross-sectional view of a packaged microelectronic imager in accordance with the prior art.

FIG. 1 is a schematic side cross-sectional view of a conventional packaged microelectronic imager 1. The imager 1 includes a die 10, an interposer substrate 20 attached to the die 10, a housing 30 attached to the interposer substrate 20, and an optics unit 70 attached to the housing 30. The housing 30 has an opening 32 over the die 10 and a transparent cover 40 in the opening 32. The optics unit 70 can include a lens 74 and other optical elements to direct light through the opening 32 and toward the die 10.

The die 10 includes an image sensor 12 and a plurality of bond-pads 14 electrically coupled to the image sensor 12. The interposer substrate 20 is a dielectric member having a plurality of interior pads 22, a plurality of ball-pads 24, and a plurality of traces 26 electrically coupling the interior pads 22 to corresponding ball-pads 24. The ball-pads 24 are arranged in an array for surface mounting the imager 1 to a board or module of another device. The bond-pads 14 on the die 10 are electrically coupled to corresponding interior pads 22 on the interposer substrate 20 by a plurality of wire-bonds 28 to provide electrical pathways between the bond-pads 14 and the ball-pads 24.

One problem with conventional packaged microelectronic imagers is that they have relatively large footprints and occupy a significant amount of vertical space (i.e., high profiles). For example, the footprint of the imager 1 in FIG. 1 is the surface area of the bottom of the interposer substrate 20, which is significantly larger than the surface area of the die 10. Accordingly, the footprint of conventional packaged microelectronic imagers can be a limiting factor in the design and marketability of picture cell phones or PDAs because these devices are continually shrinking to be more portable. Therefore, there is a need to provide microelectronic imagers with smaller footprints and lower vertical profiles.

Another problem with conventional microelectronic imagers is the manufacturing costs for packaging the dies. For example, forming the wire-bonds on the imager shown in FIG. 1 is complex and expensive because it requires connecting an individual wire between each bond-pad on the die and a corresponding pad on the interposer substrate. In addition, it may not be feasible to form wire-bonds for the high-density, fine-pitch arrays of some high-performance devices. Therefore, there is a significant need to enhance the efficiency and reliability of packaging microelectronic imagers.

BRIEF DESCRIPTION OF THE DRAWINGS

FIGS. 2A–2E illustrate various stages in a method of forming a cover substrate for use in microelectronic imaging devices in accordance with one embodiment of the invention.

FIGS. 3A–3C illustrate various stages in a method of forming a microelectronic imaging device in accordance with one embodiment of the invention.

DETAILED DESCRIPTION

A. Overview

The following disclosure describes several embodiments of microelectronic imaging devices and methods of packaging microelectronic imaging devices. Specific details of several embodiments of the invention are described below with reference to CMOS imagers to provide a thorough understanding of these embodiments, but other embodiments can be CCD imagers or other types of imaging devices. Several details describing well-known structures often associated with microelectronic devices are not set forth in the following description to avoid unnecessarily obscuring the description of the disclosed embodiments. Additionally, several other embodiments of the invention can have different configurations and/or components than those described in this section. As such, a person of ordinary skill in the art will accordingly understand that the invention may have other embodiments with additional elements or without several of the elements shown and described below with reference to FIGS. 2A–8.

Several aspects of the invention are directed to a plurality of microelectronic imaging devices formed at the wafer level. In one embodiment, the microelectronic imaging devices include a microfeature workpiece having a plurality of microelectronic dies. The individual dies include an integrated circuit, an image sensor electrically coupled to the integrated circuit, and a plurality of bond-pads electrically coupled to the integrated circuit. The microelectronic imaging devices further include a cover substrate over the image sensors of the dies. The cover substrate is transmissive to radiation for the image sensors and has a plurality of electrically conductive interconnects electrically coupled to corresponding bond-pads on the dies. In one aspect of this embodiment, the interconnects extend through the cover substrate. Alternatively, the interconnects can extend along the surface of the cover substrate that faces the image sensors. Individual interconnects can be electrically connected to a pair of bond-pads of adjacent dies to couple the cover substrate to the workpiece, or the individual interconnects can be electrically coupled to corresponding individual bond-pads. For example, an interconnect can be directly connected to a bond-pad, or an interconnect can be indirectly connected to a bond-pad via a solder ball or other conductive element.

Another aspect of the invention is directed to individual microelectronic imaging devices. In one embodiment, a microelectronic imaging device includes a microelectronic die having an integrated circuit, an image sensor electrically coupled to the integrated circuit, and a plurality of bond-pads electrically coupled to the integrated circuit. The imaging device further includes a cover over the image sensor and a plurality of interconnects in and/or on the cover to provide external electrical contacts electrically connected to the bond-pads of the die. In one aspect of this embodiment, the interconnects wrap around corresponding ends of the cover. Alternatively, the interconnects can extend through the cover and be aligned with the corresponding bond-pads. In another aspect of this embodiment, the microelectronic imaging device further includes a substrate having an opening and an optics unit disposed at least partially within the opening. The cover is disposed between the substrate and the microelectronic die, and the optics unit is aligned with the image sensor on the die.

Another aspect of the invention is directed to methods of packaging microelectronic imaging devices. In one embodiment, a method includes providing a microelectronic die having an integrated circuit, an image sensor electrically coupled to the integrated circuit, and a plurality of bond-pads electrically coupled to the integrated circuit. The method further includes providing a cover having a first surface, a second surface opposite the first surface, and a plurality of interconnects extending from the first surface to the second surface. The method further includes coupling the cover to the microelectronic die with the cover over the image sensor and with the interconnects electrically coupled to corresponding bond-pads.

B. Embodiments of Methods of Forming Cover Substrates

Figure 2A:
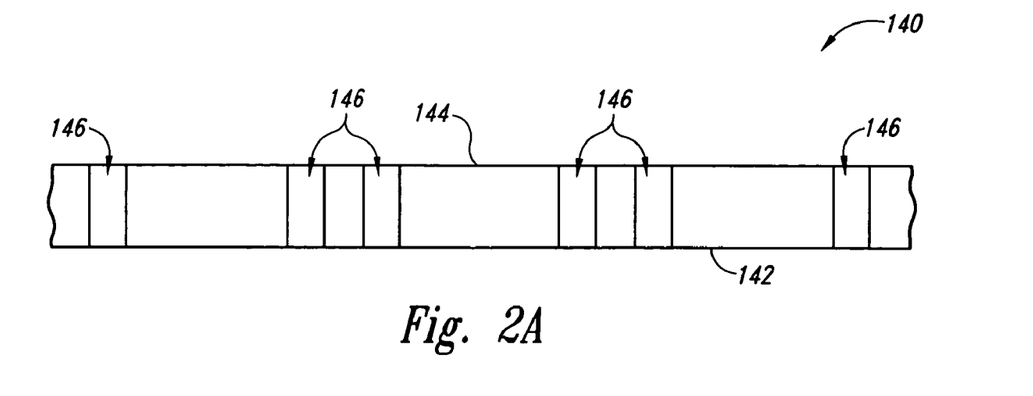
FIG. 2A is a schematic side cross-sectional view of the cover substrate after forming a plurality of apertures.

FIGS. 2A–2E illustrate various stages in a method of forming a cover substrate for use in microelectronic imaging devices in accordance with one embodiment of the invention. FIG. 2A, more specifically, is a schematic side cross-sectional view of a cover substrate 140 for covering a plurality of image sensor dies. As such, the cover substrate 140 can be glass, quartz, or other suitable materials transmissive to a desired spectrum of radiation. In embodiments directed toward imaging radiation in the visible spectrum, the cover substrate 140 can also have films that filter ultraviolet, infrared radiation, or other undesirable spectrums of radiation. The cover substrate 140, for example, can be formed from a material and/or have a coating that filters IR or near IR spectrums.

In the illustrated embodiment, the cover substrate 140 includes a first surface 142, a second surface 144 opposite the first surface 142, and a plurality of apertures 146 extending from the first surface 142 to the second surface 144. The apertures 146 can be arranged in arrays, with individual arrays corresponding to individual arrays of bond-pads on a microelectronic die. More specifically, the apertures 146 can be arranged so that each aperture 146 is aligned with a bond-pad on a die when the cover substrate 140 is placed over the dies in proper alignment, as described in greater detail below. The apertures 146 can be formed in the cover substrate 140 by laser drilling, etching, and/or other suitable processes. Although the cover substrate 140 illustrated in FIG. 2A has apertures 146 extending completely through the substrate 140, other embodiments of cover substrates in accordance with the invention may not include apertures 146 that extend through the substrates.

Figure 2B:
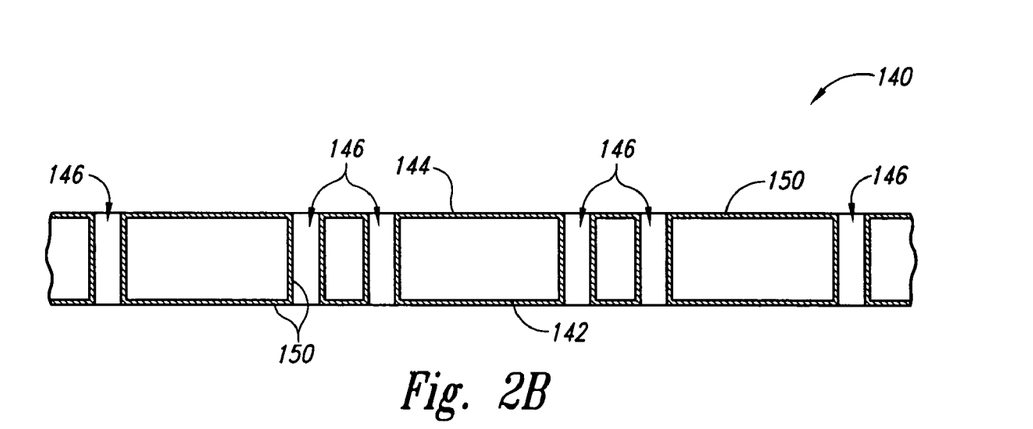
FIG. 2B is a schematic side cross-sectional view of the cover substrate after forming a first conductive layer.

FIG. 2B is a schematic side cross-sectional view of the cover substrate 140 after forming a first conductive layer 150 on the substrate 140. The first conductive layer 150 can be a seed layer deposited in the apertures 146 and across the first and second surfaces 142 and 144 of the cover substrate 140. The first conductive layer 150 can include TiNitride, $TiCl_4$, and/or other suitable materials, and the layer 150 be formed by atomic layer deposition (ALD), chemical vapor deposition (CVD), physical vapor deposition (PVD), or other suitable processes. In other embodiments, the first conductive layer 150 may not be deposited across the entire first and/or second surface 142 and/or 144.

Figure 2C:
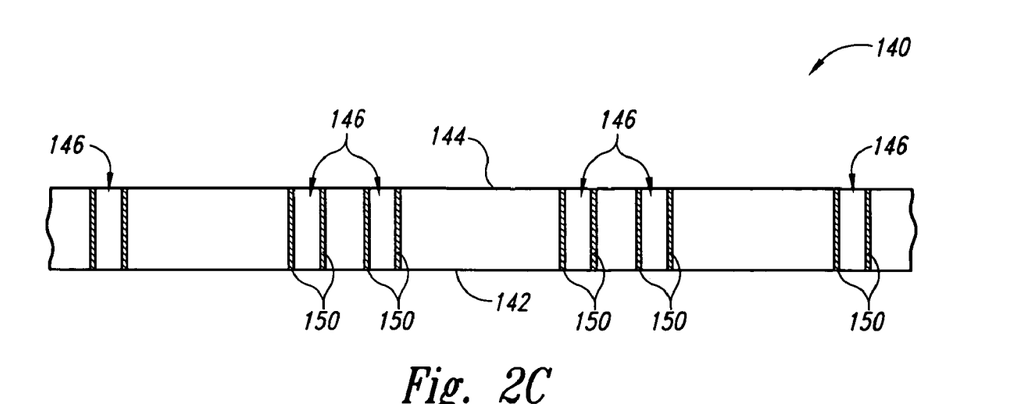
FIG. 2C is a schematic side cross-sectional view of the cover substrate after removing a portion of the first conductive layer.

FIG. 2C is a schematic side cross-sectional view of the cover substrate 140 after removing the portion of the first conductive layer 150 on the first and second surfaces 142 and 144. In this embodiment, the first conductive layer 150 in the apertures 146 is not removed. Portions of the first conductive layer 150 can be removed by etching, chemical-mechanical polishing, and/or other suitable processes. In additional embodiments, sections of the first conductive layer 150 on the first and/or second surface 142 and/or 144 may not be removed.

Figure 2D:
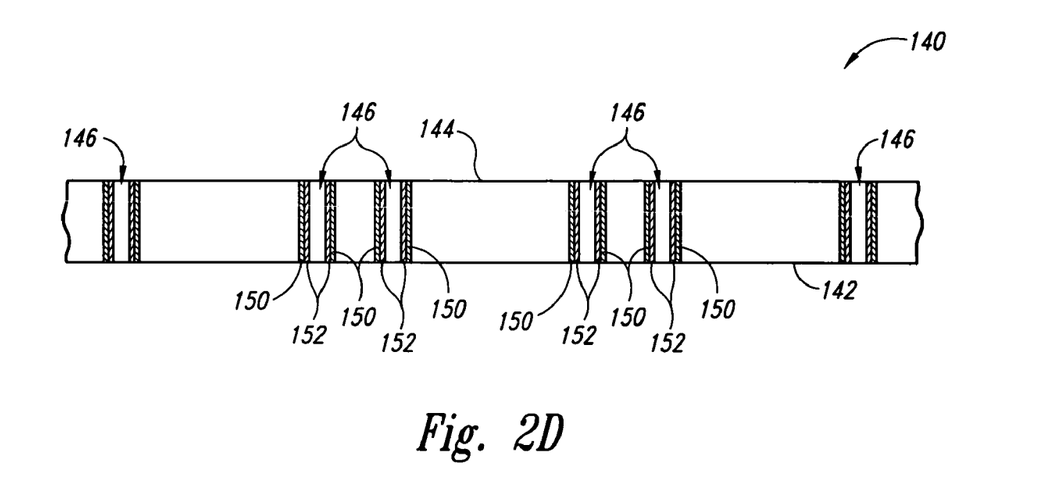
FIG. 2D is a schematic side cross-sectional view of the cover substrate after forming a second conductive layer on the first conductive layer.

FIG. 2D is a schematic side cross-sectional view of the cover substrate 140 after forming a second conductive layer 152 on the first conductive layer 150 in the apertures 146. The second conductive layer 152 can include nickel, copper, and/or other suitable materials, and the layer 152 can be formed by electroless plating or other suitable methods. The second conductive layer 152 provides desired wetting characteristics so that the apertures 146 can be subsequently filled with a conductive material. Alternatively, the second conductive layer can fill the apertures 146 so that subsequent filling with the conductive material is unnecessary. In additional embodiments, the cover substrate 140 may not include the second conductive layer 152 if the first conductive layer 150 is compatible or otherwise provides the desired wetting characteristics for the conductive fill material.

Figure 2E:
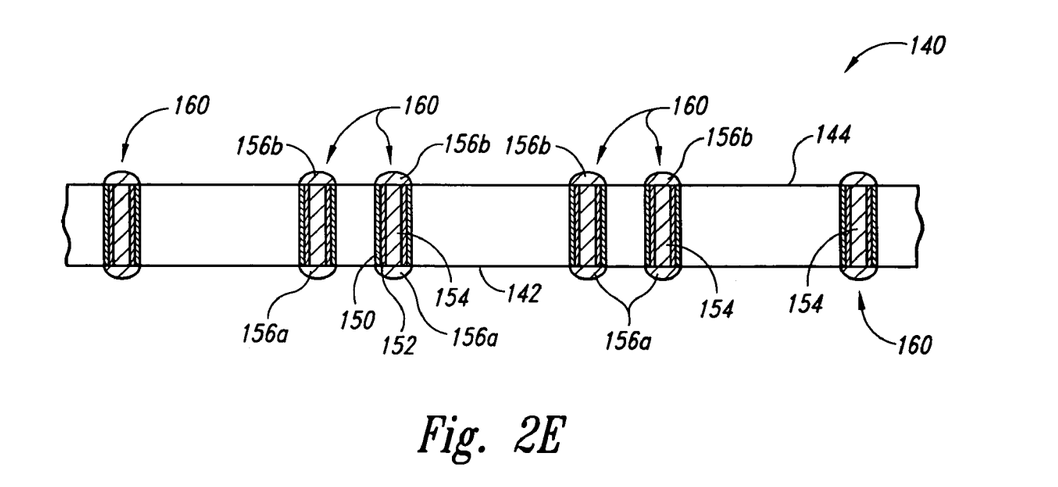
FIG. 2E is a schematic side cross-sectional view of the cover substrate after forming a plurality of interconnects in the apertures.

FIG. 2E is a schematic side cross-sectional view of the cover substrate 140 after forming a plurality of interconnects 160 in the apertures 146. After the second layer 152 has been formed on the first conductive layer 150, a conductive fill material 154 can be deposited into the apertures 146 to fill the remaining void between the first surface 142 and the second surface 144. The conductive fill material 154 can include solder, conductive epoxy, conductive polymers, and/or other materials. The conductive fill material 154, the second conductive layer 152, and the first conductive layer 150 in each aperture 146 form individual interconnects 160 that extend from the first surface 142 to the second surface 144. The interconnects 160 are electrically conductive to transmit electrical signals through the cover substrate 140. For example, the cover substrate 140 can transmit an electrical signal from a microelectronic die to an external device, as described in greater detail below.

In the illustrated embodiment, the interconnects 160 include a first cap 156a projecting from the first surface 142 and a second cap 156b projecting from the second surface 144. The caps 156a–b provide external contacts to electrically couple the interconnects 160 to other devices. In additional embodiments, the interconnects 160 can have different configurations and/or be formed by other suitable processes. For example, the interconnects 160 may not include caps 156a–b projecting away from the cover substrate 140, and/or the interconnects 160 may not include all of the first conductive layer 150, the second conductive layer 152, and the conductive material 154. Moreover, the interconnects 160 may also extend at least partially along the first and/or second surface 142 and/or 144. Furthermore, as described below with reference to FIGS. 7A–7B, the interconnects 160 may not extend through the cover substrate 140 from the first surface 142 to the second surface 144, but rather the interconnects 160 can extend around the perimeter of a singulated portion of the cover substrate 140.

C. Embodiments of Microelectronic Imaging Devices

Figure 3A:
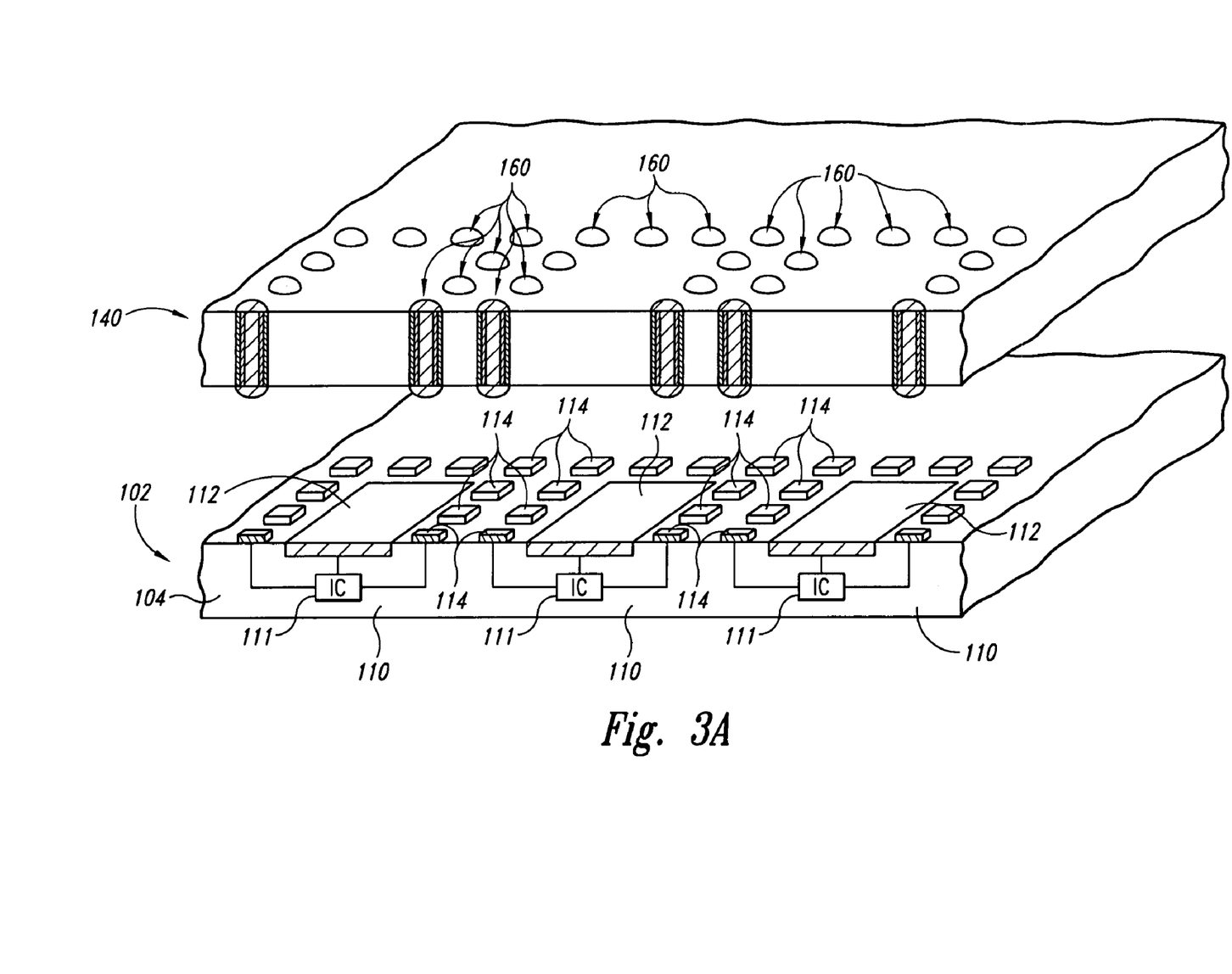
FIG. 3A is a schematic isometric cross-sectional view of a microfeature workpiece and the cover substrate of FIG. 2E.
Figure 3B:
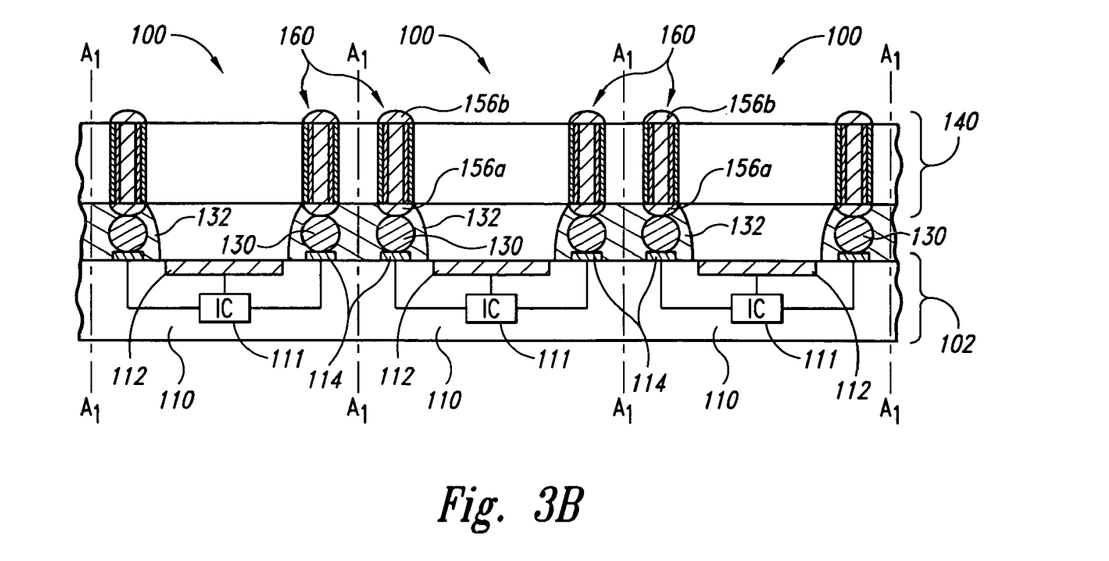
FIG. 3B is a schematic side cross-sectional view of the microfeature workpiece after attaching the cover substrate.
Figure 3C:
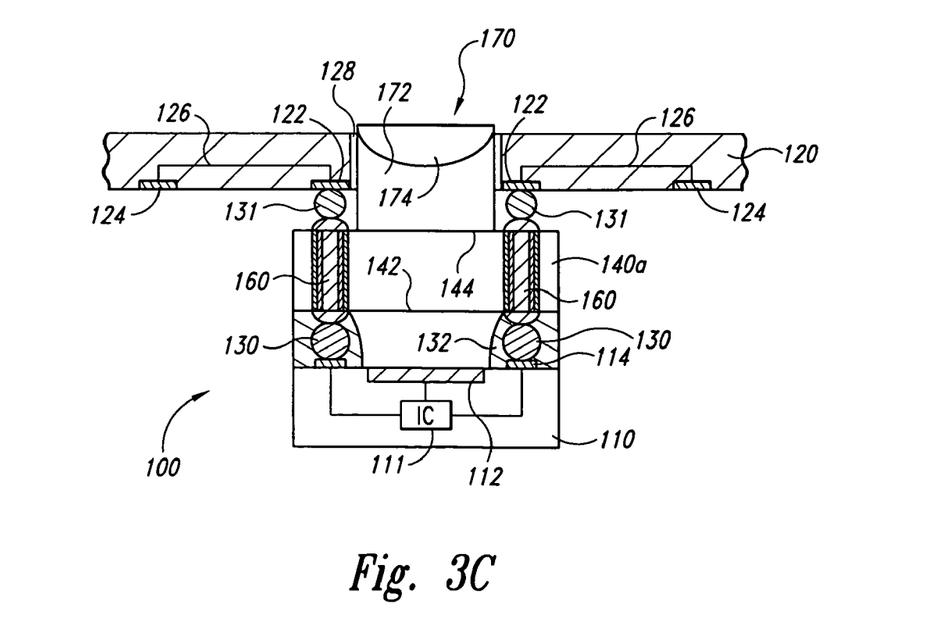
FIG. 3C is a schematic side cross-sectional view of an individual microelectronic imaging device after singulation.

FIGS. 3A–3C illustrate various stages in a method of forming microelectronic imaging devices in accordance with one embodiment of the invention. FIG. 3A, more specifically, is a schematic isometric cross-sectional view of a microfeature workpiece 102 and the cover substrate 140 of FIG. 2E. The microfeature workpiece 102 includes a substrate 104 and a plurality of microelectronic dies 110 formed in and/or on the substrate 104. In the illustrated embodiment, the individual dies 110 include an integrated circuit 111 (shown schematically), an image sensor 112 operably coupled to the integrated circuit 111, and a plurality of bond-pads 114 electrically coupled to the integrated circuit 111. The image sensors 112 can be CMOS devices or CCDs for capturing pictures or other images in the visible spectrum. In other embodiments, the image sensors 112 can detect radiation in other spectrums (e.g., IR or UV ranges). The bond-pads 114 are arranged in arrays that correspond with the arrangement of interconnects 160 in corresponding arrays on the cover substrate 140. As such, each bond-pad 114 can be aligned with a corresponding interconnect 160, as described in detail below.

FIG. 3B is a schematic side cross-sectional view of the microfeature workpiece 102 after attaching the cover substrate 140. A plurality of conductive elements 130 are deposited onto the bond-pads 114 and/or the interconnects 160 to physically attach the cover substrate 140 to the microfeature workpiece 102. The conductive elements 130 can be solder balls or other conductive devices that electrically connect the interconnects 160 to corresponding bond-pads 114. Accordingly, the interconnects 160 provide external electrical contacts for the bond-pads 114 of the dies 110. In other embodiments, the cover substrate 140 can be attached to the microfeature workpiece 102 without the conductive elements 130. For example, the first caps 156a can be attached directly to the corresponding bond-pads 114.

In the illustrated embodiment, a partial underfill material 132 is deposited around the periphery of each image sensor 112. The underfill material 132 can be deposited between rows of bond-pads 114 of adjacent bond-pad arrays. The underfill material 132 flows between the bond-pads 114 and the conductive elements 130. The underfill material 132 enhances the integrity of the joint between the cover substrate 140 and the microelectronic dies 110 and protects the image sensors 112 from moisture, chemicals, and other contaminants. In other embodiments, such as those described below with reference to FIG. 4, the underfill material 132 may be deposited across the image sensors 112, or alternatively, the underfill material 132 may not be deposited between the microfeature workpiece 102 and the cover substrate 140.

In the illustrated embodiment, the interconnects 160 are aligned with the bond-pads 114 of the dies 110 when the cover substrate 140 is attached to the microfeature workpiece 102. As such, the interconnects 160 are positioned outboard the image sensors 112 so as not to obstruct radiation from passing through the cover substrate 140 toward the image sensors 112. After attachment, the microfeature workpiece 102 and the cover substrate 140 can be cut along lines $A_1$—$A_1$ to singulate individual microelectronic imaging devices 100. The microelectronic imaging devices 100 can pass through the reflow process to melt the conductive elements 130 and securely join the interconnects 160 to the bond-pads 114, and/or the underfill material 132 can be cured before and/or after singulation.

One feature of the illustrated embodiment is that the microelectronic imaging devices 100 can be tested at the wafer level before the devices 100 are singulated. For example, a testing device can contact the second caps 156b of the interconnects 160 to simultaneously test all or at least many of the microelectronic imaging devices 100. Microelectronic imaging devices that do not function properly can be segregated and discarded after singulation. An advantage of this feature is that it is more efficient in terms of cost and time to test the microelectronic imaging devices 100 at the wafer level (i.e., before singulation) than to test each device 100 individually.

Another feature of the illustrated embodiment is that the cover substrate 140 is attached to the microfeature workpiece 102 before singulation. An advantage of this feature is that the image sensors 112 are covered by the cover substrate 140, and consequently protected from the debris and other material that are generated during the singulation process.

Another feature of the illustrated embodiment is that the interconnects 160 of the cover substrate 140 provide external electrical contacts for the individual microelectronic imaging devices 100. An advantage of this feature is that forming interconnects in the cover substrate 140 is less complex and exposes the imaging devices 100 to less heat than forming interconnects through the workpiece 102, from the bond-pads to the back side of the imaging devices.

FIG. 3C is a schematic side cross-sectional view of an individual microelectronic imaging device 100 after singulation. The singulated microelectronic imaging device 100 includes a die 110 and a cover 140a over the image sensor 112 of the die 110. The singulated microelectronic imaging device 100 can be mounted to a substrate 120, such as a circuit board, flex tape, or other suitable member, to redistribute electrical signals from the integrated circuit 111 of the die 110 to an external device. For example, in the illustrated embodiment, the substrate 120 includes a plurality of interior pads 122, a plurality of ball-pads 124, and a plurality of traces 126 electrically coupling the interior pads 122 to corresponding ball-pads 124. A plurality of conductive elements 131 physically attach the microelectronic imaging device 100 to the substrate 120 and form an electrical connection between the interconnects 160 and corresponding interior pads 122. Thus, the ball-pads 124 on the substrate 120 are electrically connected to the integrated circuit 111 of the die 110.

In the illustrated embodiment, the substrate 120 includes an opening 128 over the image sensor 112, and an optics unit 170 is disposed at least partially within the opening 128. The optics unit 170 is attached to the cover 140a and/or the substrate 120, and the optics unit 170 is aligned with the image sensor 112. The optics unit 170 can include a stand off 172 and an optic member 174 on the stand off 172 to transmit at least the desired spectrum of radiation to the image sensor 112. The optic member 174 can be a lens for focusing the light, a pinhole for reducing higher order refractions, and/or other optical structures for performing other functions. Suitable optics units and methods of attaching optics units are disclosed in U.S. patent application Ser. No. 10/723,363, entitled Packaged Microelectronic Imagers and Methods of Packaging Microelectronic Imagers, filed on Nov. 26, 2003, which is hereby incorporated by reference in its entirety. In additional embodiments, the microelectronic imaging device 100 may not be attached to the substrate 120 and/or optics unit 170, or the substrate 120 and/or optics unit 170 can be attached in a different arrangement.

An advantage of the embodiment illustrated in FIG. 3C is that placing the optics unit 170 in the opening 128 of the substrate 120 reduces the vertical profile or height of the device. More specifically, the vertical profile of the device 100 is the distance between the top of the optics unit 170 and the bottom of the die 110. In prior art devices, such as the device illustrated in FIG. 1, the vertical profile of the device is the distance between the top of the optics unit 70 and the bottom of the substrate 20 attached to the back side of the die 10. Thus, the vertical profile of the device illustrated in FIG. 3C is reduced by at least the thickness of the substrate 120 because the optics unit 170 is placed in the opening 128 of the substrate 120 instead of mounting the back side of the die 110 to the substrate 120.

Another feature of the illustrated embodiment is that the interconnects 160 electrically couple the bond-pads 114 to the interior pads 122 and therefore eliminate the need for wire-bonds. An advantage of this feature is that without wire-bonds, the footprint of the substrate 120 can be smaller because the interconnects 160 are coupled to the substrate 120 directly over the die 110. The reduced footprint allows the illustrated device to be used in smaller electronic devices. In prior art devices, such as the device illustrated in FIG. 1, the bond-pads 14 are wire-bonded to interior pads 22 outboard the die 10, which increases the footprint of the substrate 20.

D. Additional Embodiments of Microelectronic Imaging Devices

Figure 4:
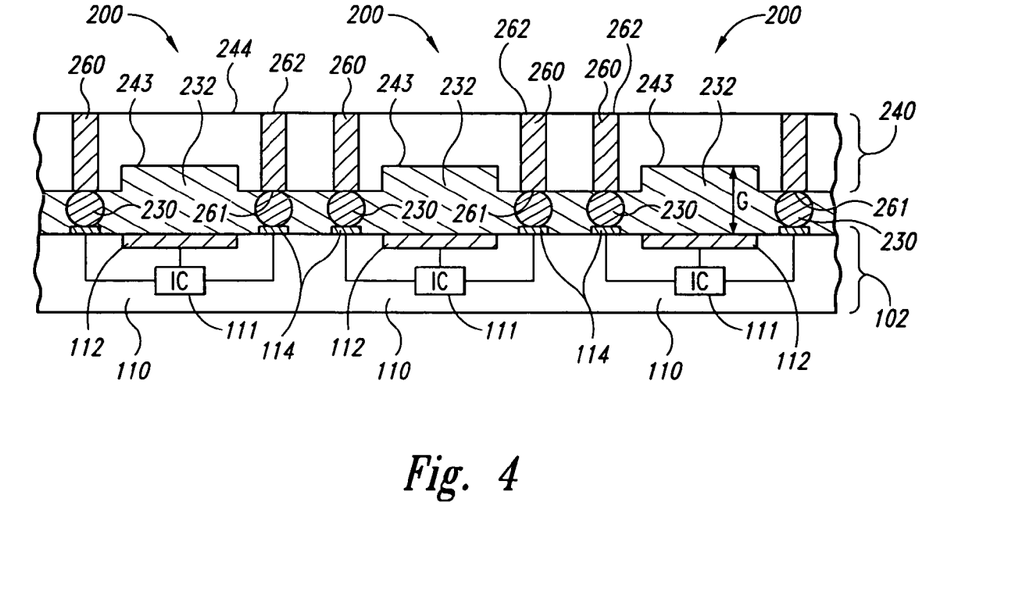
FIG. 4 is a schematic side cross-sectional view of a plurality of microelectronic imaging devices in accordance with another embodiment of the invention.

FIG. 4 is a schematic side cross-sectional view of a plurality of microelectronic imaging devices 200 in accordance with another embodiment of the invention. The microelectronic imaging devices 200 can be generally similar to the microelectronic imaging devices 100 described above with reference to FIGS. 2A–3C. For example, the microelectronic imaging devices 200 are formed at the wafer level by attaching a cover substrate 240 to the microfeature workpiece 102. The illustrated cover substrate 240 includes a first surface 242, a second surface 244 opposite the first surface 242, and a plurality of interconnects 260 extending from the first surface 242 to the second surface 244. The interconnects 260 include an electrically conductive material to provide external contacts for the bond-pads 114 of the microelectronic dies 110. The individual interconnects 260 include a first end 261 generally planar with the first surface 242 and a second end 262 generally planar with the second surface 244. The microelectronic imaging devices 200 further include a plurality of conductive elements 230 on corresponding second ends 262 to electrically connect the interconnects 260 to corresponding bond-pads 114. In other embodiments, the cover substrate 240 can include a plurality of ball-pads formed in and/or on the substrate 240 to connect the interconnects 260 to corresponding conductive elements 230.

In the illustrated embodiment, the cover substrate 240 further includes a plurality of recesses 243 in the first surface 242 over corresponding image sensors 112. The recesses 243 create a gap G between the cover substrate 240 and the image sensors 112. An underfill material 232 can be deposited in the gap G and across the microfeature workpiece 102 to substantially fill the void between the workpiece 102 and the cover substrate 240. The underfill material 232 is a transmissive material to permit light and/or other electromagnetic radiation to pass through the underfill material 232 and contact the image sensors 112. For example, the underfill material 232 can be an optical-grade material with a high transparency and a uniform mass density to allow maximum light transmission. The underfill material 232 can also be a highly pure material to minimize contamination and thereby reduce or eliminate the loss of images and/or light scattering. In other embodiments, the underfill material 232 may not be deposited in the gap G.

Figure 5:
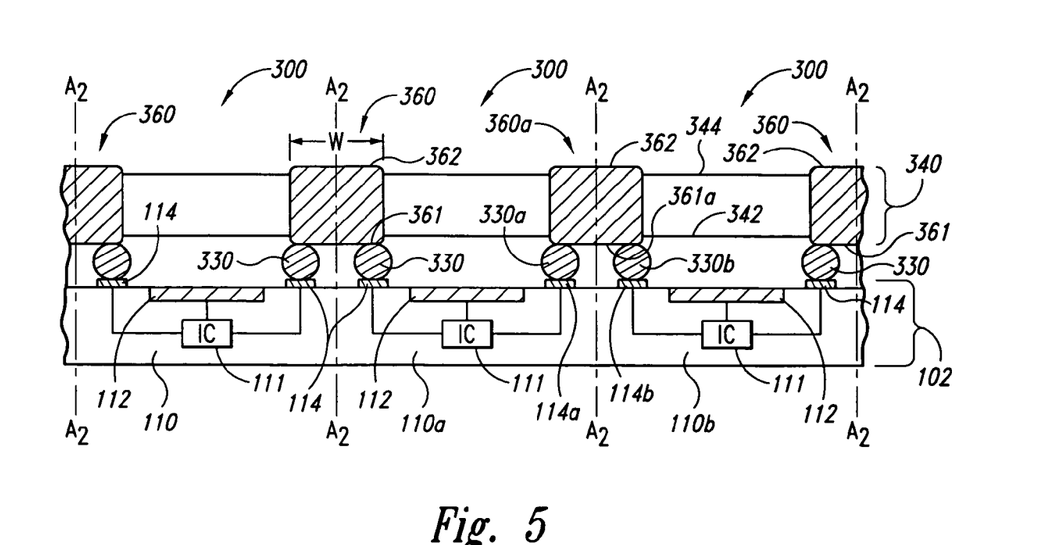
FIG. 5 is a schematic side cross-sectional view of a plurality of microelectronic imaging devices in accordance with another embodiment of the invention.

FIG. 5 is a schematic side cross-sectional view of a plurality of microelectronic imaging devices 300 in accordance with another embodiment of the invention. The microelectronic imaging devices 300 can be generally similar to the microelectronic imaging devices 100 described above with reference to FIGS. 2A–3C. For example, the microelectronic imaging devices 300 are formed at the wafer level by attaching a cover substrate 340 to the microfeature workpiece 102. The cover substrate 340 includes a first surface 342, a second surface 344 opposite the first surface 342, and a plurality of interconnects 360 extending from the first surface 342 to the second surface 344. The interconnects 360 have a first end 361 proximate to the first surface 342 and a second end 362 proximate to the second surface 344.

In the illustrated embodiment, the individual interconnects 360 have a width W sized to contact a pair of conductive elements 330 on adjacent dies 110. For example, a first end 361a of a first interconnect 360a can be coupled to a first conductive element 330a on a first bond-pad 114a of a first die 110a and a second conductive element 330b on a second bond-pad 114b of a second die 110b adjacent to the first die 110a. To singulate the microelectronic imaging devices 300, the microfeature workpiece 102, the cover substrate 340, and the interconnects 360 can be cut along lines $A_2$—$A_2$. Accordingly, each singulated microelectronic imaging device 300 includes a cover (i.e., a section of the cover substrate 340) with interconnects (i.e., sections of the interconnects 360) that extend along corresponding ends of the cover.

Figure 6:
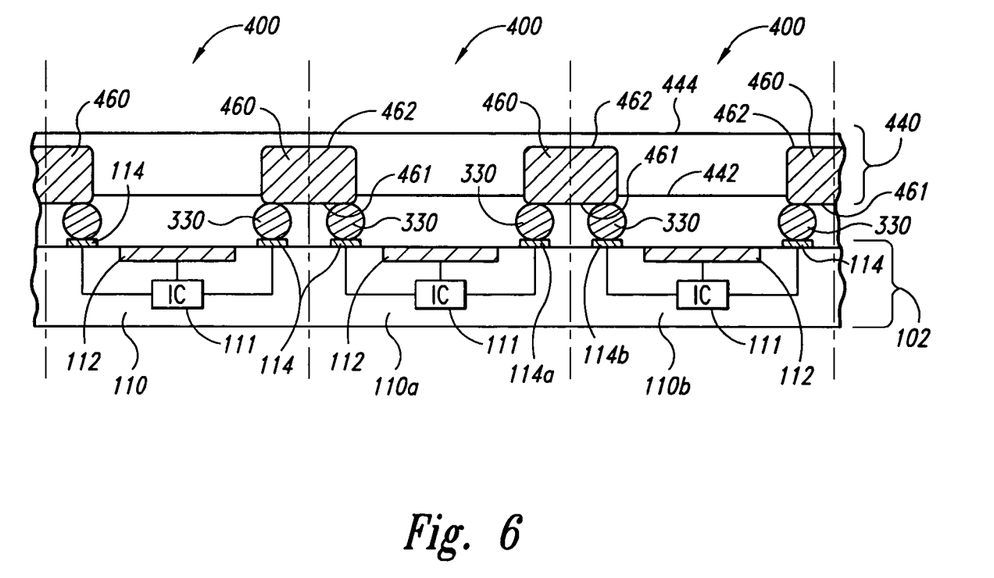
FIG. 6 is a schematic side cross-sectional view of a plurality of microelectronic imaging devices in accordance with another embodiment of the invention.

FIG. 6 is a schematic side cross-sectional view of a plurality of microelectronic imaging devices 400 in accordance with another embodiment of the invention. The microelectronic imaging devices 400 can be generally similar to the microelectronic imaging devices 300 described above with reference to FIG. 5. The microelectronic imaging devices 400, however, include a plurality of interconnects 460 that do not extend completely through a cover substrate 440. More specifically, the interconnects 460 have a first end 461 proximate to a first surface 442 of the cover substrate 440 and a second end 462 spaced apart from a second surface 444 of the substrate 440. After singulation, the individual microelectronic imaging devices 400 include portions of the interconnects 460, which provide external electrical contacts, or as described below with reference to FIGS. 7A and 7B, to which another interconnect can be attached.

Figure 7A:
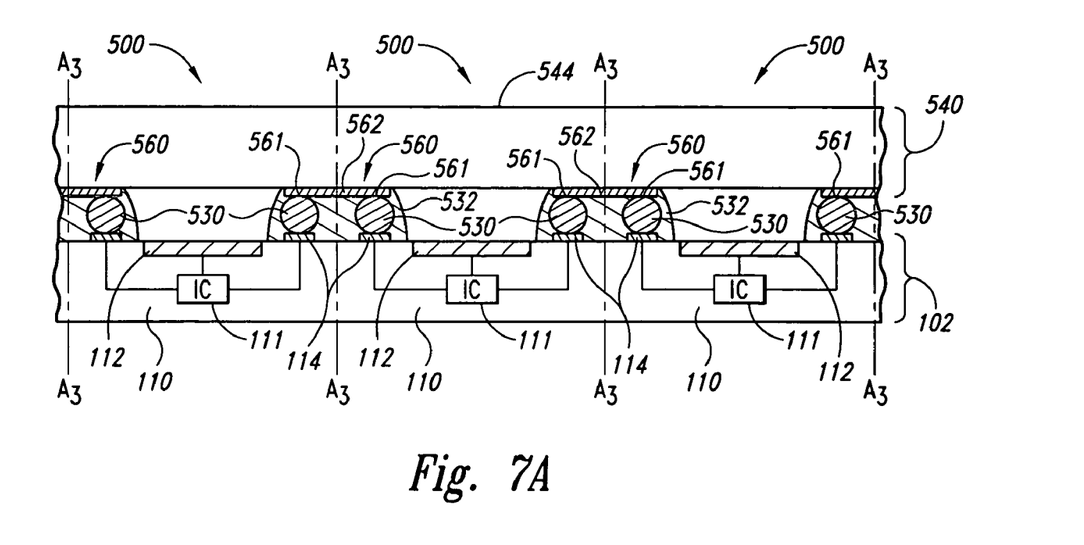
FIG. 7A is a schematic side cross-sectional view of a plurality of microelectronic imaging devices in accordance with another embodiment of the invention.

FIG. 7A is a schematic side cross-sectional view of a plurality of microelectronic imaging devices 500 in accordance with another embodiment of the invention. The microelectronic imaging devices 500 can be generally similar to the microelectronic imaging devices 100 described above with reference to FIGS. 2A–3C. For example, the microelectronic imaging devices 500 are formed at the wafer level by attaching a cover substrate 540 to the microfeature workpiece 102. The illustrated cover substrate 540 includes a first surface 542, a second surface 544 opposite the first surface 542, and a plurality of interconnects 560 formed in and/or on the first surface 542. The individual interconnects 560 include end portions 561 aligned with corresponding bond-pads 114 and a second portion 562 between corresponding end portions 561. A plurality of conductive elements 530 attach the end portions 561 of the interconnects 560 to the bond-pads 114. In additional embodiments, the interconnects 560 can include a ball-pad to receive corresponding conductive elements 530. The illustrated microelectronic imaging devices 500 can be singulated by cutting the microfeature workpiece 102, the interconnects 560, and the cover substrate 540 along lines $A_3$—$A_3$.

Figure 7B:
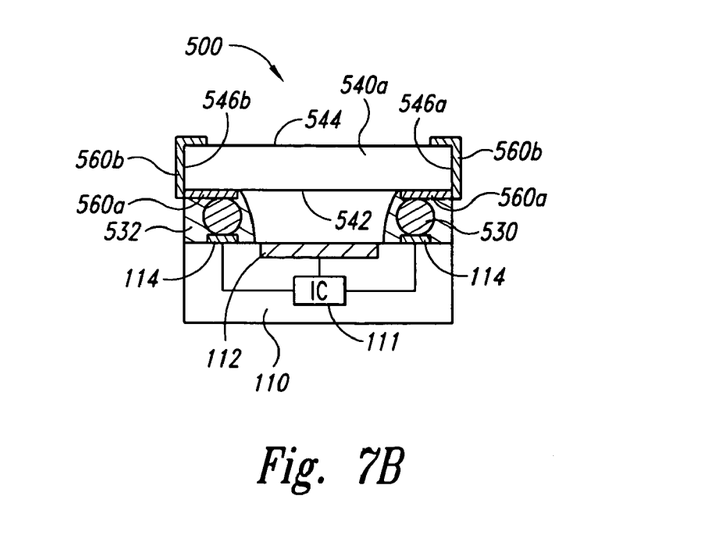
FIG. 7B is a schematic side cross-sectional view of an individual microelectronic imaging device of FIG. 7A after singulation.

FIG. 7B is a schematic side cross-sectional view of one of the microelectronic imaging devices 500 of FIG. 7A after singulation. After singulation, the microelectronic imaging device 500 includes a cover 540a with a plurality of ends 546 (two of which are shown as 546a–b). A plurality of second interconnects 560b can be formed on the cover 540a to provide external contacts for the bond-pads 114 of the die 110. The second interconnects 560b can be connected to corresponding first interconnects 560a and extend from the first surface 542 to the second surface 544 around corresponding ends 546 of the cover 540a. The second interconnects 560b can include conductive tape or other suitable electrically conductive material so that the first and second interconnects 560a–b form conductive lines that wrap around the cover 540a from corresponding conductive elements 530 to the second surface 544.

Figure 8:
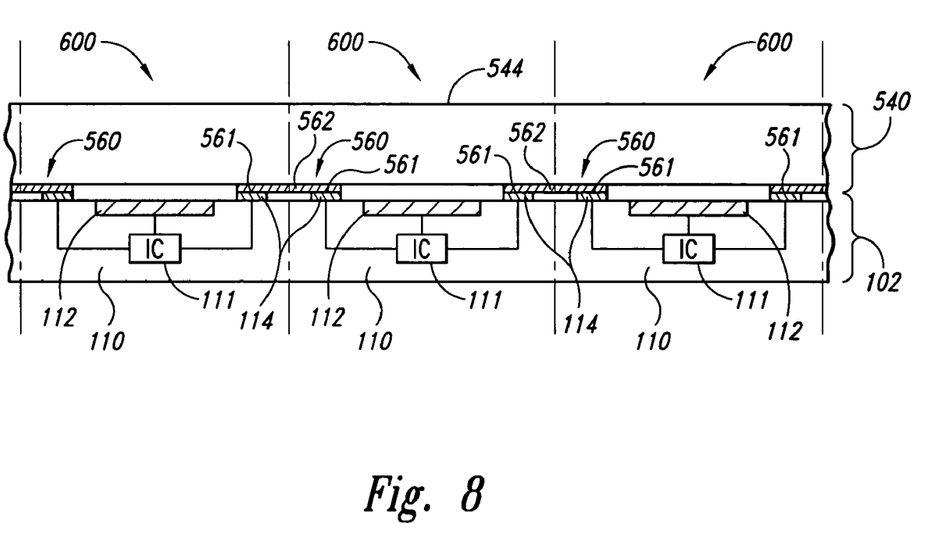
FIG. 8 is a schematic side cross-sectional view of a plurality of microelectronic imaging devices in accordance with another embodiment of the invention.

FIG. 8 is a schematic side cross-sectional view of a plurality of microelectronic imaging devices 600 in accordance with another embodiment of the invention. The microelectronic imaging devices 600 can be generally similar to the microelectronic imaging devices 500 described above with reference to FIG. 7A. The microelectronic imaging devices 600, however, do not include conductive elements coupling the interconnects 560 to the bond-pads 114, but rather the end portions 561 are attached to corresponding bond-pads 114.

From the foregoing, it will be appreciated that specific embodiments of the invention have been described herein for purposes of illustration, but that various modifications may be made without deviating from the spirit and scope of the invention. For example, the microelectronic imaging devices can have any combination of the features described above with reference to FIGS. 2A–8. Accordingly, the invention is not limited except as by the appended claims.

We claim:

1. A plurality of microelectronic imaging devices, comprising:
    a microfeature workpiece including a plurality of microelectronic dies, the individual dies having an integrated circuit, an image sensor electrically coupled to the integrated circuit, and a plurality of bond-pads electrically coupled to the integrated circuit; and
    a cover substrate over at least one of the image sensors, the cover substrate including a plurality of interconnect arrays with each individual interconnect electrically coupled to a corresponding pair of adjacent bond-pads, the cover substrate being transmissive to radiation for the image sensors.

2. The microelectronic imaging devices of claim 1 wherein:
    the cover substrate further includes a first surface and a second surface opposite the first surface; and
    the interconnects extend from the first surface to the second surface of the cover substrate.

3. The microelectronic imaging devices of claim 1 wherein:
    the cover substrate further includes a first surface facing the image sensors and a second surface opposite the first surface, the first surface having a plurality of recesses over corresponding image sensors; and
    the interconnects extend from the first surface to the second surface.

4. The microelectronic imaging devices of claim 1 wherein the interconnects extend through the cover substrate.

5. The microelectronic imaging devices of claim 1 wherein:
    the cover substrate further includes a first surface facing toward the image sensors and a second surface opposite the first surface; and
    the interconnects are formed in and/or on the first surface of the cover substrate and extend outwardly away from the corresponding image sensors.

6. The microelectronic imaging devices of claim 1 wherein the interconnects are outboard the corresponding image sensors.

7. The microelectronic imaging devices of claim 1 wherein the interconnects are superimposed above corresponding bond-pads.

8. The microelectronic imaging devices of claim 1 wherein the interconnects provide external electrical contacts for the bond-pads.

9. A plurality of microelectronic imaging devices, comprising:
an image substrate including a plurality of dies in and/or on the image substrate, wherein individual dies include an integrated circuit, an image sensor electrically coupled to the integrated circuit, and a plurality of bond-pads electrically coupled to the integrated circuit;
a cover substrate coupled to the image substrate over the image sensors, the cover substrate being transmissive to radiation for the image sensors; and
a plurality of interconnects in and/or on the cover substrate, the interconnects being arranged in individual arrays corresponding to the bond-pads of individual dies to provide external electrical contacts for the bond-pads of the dies, and wherein each individual interconnect is coupled to a corresponding pair of adjacent bond-pads.

10. The microelectronic imaging devices of claim 9 wherein:
the cover substrate includes a first surface and a second surface opposite the first surface; and
the interconnects extend through the cover substrate from the first surface to the second surface of the cover substrate to define front side interconnects.

11. The microelectronic imaging devices of claim 9 wherein the interconnects extend through the cover substrate.

12. The microelectronic imaging devices of claim 9 wherein:
the cover substrate includes a first surface facing toward the image sensors and a second surface opposite the first surface; and
the interconnects are formed in and/or on the first surface of the cover substrate and extend outwardly away from the corresponding image sensors.

13. The microelectronic imaging devices of claim 9 wherein the interconnects are outboard the corresponding image sensors.

14. The microelectronic imaging devices of claim 9 wherein the interconnects are superimposed above corresponding bond-pads.

15. A plurality of microelectronic imaging devices, comprising:
a microfeature workpiece including a plurality of microelectronic dies, the individual dies having an integrated circuit, an image sensor electrically coupled to the integrated circuit, and a plurality of bond-pads electrically coupled to the integrated circuit;
a cover substrate over at least one of the image sensors, the cover substrate being transmissive to radiation for the image sensors; and
a plurality of interconnects extending through the cover substrate, each interconnect being electrically coupled to a corresponding pair of adjacent bond-pads.

16. The microelectronic imaging devices of claim 15 wherein:
the cover substrate includes a first surface and a second surface opposite the first surface; and
the interconnects extend from the first surface to the second surface of the cover substrate.

17. The microelectronic imaging devices of claim 15 wherein the interconnects are outboard the corresponding image sensors.

18. The microelectronic imaging devices of claim 15 wherein the interconnects are superimposed over corresponding bond-pads.

19. A microelectronic imaging device, comprising:
a microelectronic die including an integrated circuit, an image sensor electrically coupled to the integrated circuit, and a plurality of bond-pads electrically coupled to the integrated circuit;
a cover over the image sensor, the cover being transmissive to radiation for the image sensor and including a plurality of interconnects electrically coupled to corresponding bond-pads;
a substrate including an opening and a plurality of pads electrically coupled to corresponding interconnects, the cover being disposed between the substrate and the microelectronic die; and
an optics unit disposed at least partially within the opening and aligned with the image sensor.

20. The microelectronic imaging device of claim 19 wherein:
the cover further includes a first surface and a second surface opposite the first surface; and
the interconnects extend from the first surface to the second surface of the cover.

21. The microelectronic imaging device of claim 19 wherein the interconnects extend through the cover.

22. The microelectronic imaging device of claim 19 wherein:
the cover further includes a first surface facing toward the image sensor and a second surface opposite the first surface; and
the interconnects are formed in and/or on the first surface of the cover and extend outwardly away from the image sensor.

23. The microelectronic imaging device of claim 19 wherein:
the cover further includes a first surface, a second surface opposite the first surface, and a plurality of ends connecting the first surface to the second surface;
the first surface defines a first plane and the second surface defines a second plane; and
the interconnects extend from the first plane to the second plane along one of the ends.

24. A microelectronic imaging device, comprising:
a microelectronic die including an integrated circuit, an image sensor electrically coupled to the integrated circuit, and a plurality of bond-pads electrically coupled to the integrated circuit; and
a cover over the image sensor, the cover being transmissive to radiation for the image sensor and including a plurality of interconnects electrically coupled to corresponding bond-pads, wherein the cover further includes a first surface, a second surface opposite the first surface, and a plurality of ends connecting the first surface to the second surface, and wherein the individual interconnects wrap around one of the ends and extend from the first surface to the second surface.

25. The microelectronic imaging device of claim 19 wherein the interconnects are outboard the image sensor.

26. The microelectronic imaging device of claim 19 wherein the interconnects are superimposed over corresponding bond-pads.

27. The microelectronic imaging device of claim 19 wherein the interconnects provide external electrical contacts for the bond-pads.

28. A microelectronic imaging device, comprising:
a microelectronic die including an integrated circuit, an image sensor electrically coupled to the integrated circuit, and a plurality of bond-pads electrically coupled to the integrated circuit;
a cover over the image sensor, the cover being transmissive to visible light;
a plurality of front side interconnects in and/or on the cover, the interconnects being electrically connected to corresponding bond-pads and having an externally exposed portion;
a substrate including an opening and a plurality of pads electrically coupled to corresponding interconnects, the cover being disposed between the substrate and the microelectronic die; and
an optics unit disposed at least partially within the opening and aligned with the image sensor.

29. The microelectronic imaging device of claim 28 wherein:
the cover includes a first surface and a second surface opposite the first surface; and
the interconnects extend from the first surface to the second surface of the cover.

30. The microelectronic imaging device of claim 28 wherein the interconnects extend through the cover.

31. The microelectronic imaging device of claim 28 wherein:
the cover includes a first surface facing toward the image sensor and a second surface opposite the first surface; and
the interconnects are formed in and/or on the first surface of the cover and extend outwardly away from the image sensor.

32. A microelectronic imaging device comprising:
a microelectronic die including an integrated circuit, an image sensor electrically coupled to the integrated circuit, and a plurality of bond-pads electrically coupled to the integrated circuit;
a cover over the image sensor, the cover being transmissive to visible light, wherein the cover includes a first surface, a second surface opposite the first surface, and a plurality of ends connecting the first surface to the second surface; and
a plurality of front side interconnects in and/or on the cover, the interconnects being electrically connected to corresponding bond-pads and having an externally exposed portion, wherein the individual interconnects wrap around one of the ends and extend from the first surface to the second surface.

33. The microelectronic imaging device of claim 28 wherein the interconnects are superimposed over corresponding bond-pads.

34. A microelectronic imaging device, comprising:
a microelectronic die including an integrated circuit, an image sensor electrically coupled to the integrated circuit, and a plurality of bond-pads electrically coupled to the integrated circuit;
a cover over the image sensor, the cover including a first surface, a second surface opposite the first surface, and a plurality of interconnects extending from the first surface to the second surface, wherein the interconnects are electrically coupled to corresponding bond-pads;
a substrate including an opening and a plurality of pads electrically coupled to corresponding interconnects, the cover being disposed between the substrate and the microelectronic die; and
an optics unit disposed at least partially within the opening and aligned with the image sensor.

35. The microelectronic imaging device of claim 34 wherein the interconnects extend through the cover.

36. A microelectronic imaging device comprising:
a microelectronic die including an integrated circuit, an image sensor electrically coupled to the integrated circuit, and a plurality of bond-pads electrically coupled to the integrated circuit; and
a cover over the image sensor, the cover including a first surface, a second surface opposite the first surface, and a plurality of interconnects extending from the first surface to the second surface, wherein the interconnects are electrically coupled to corresponding bond-pads, wherein the cover further includes a plurality of ends connecting the first surface to the second surface, and wherein the individual interconnects wrap around one of the ends of the cover.

37. The microelectronic imaging device of claim 34 wherein the interconnects are outboard the image sensor.

38. The microelectronic imaging device of claim 34 wherein the interconnects are superimposed over corresponding bond-pads.

39. The microelectronic imaging device of claim 34 wherein the interconnects provide external electrical contacts for the bond-pads.

40. A microelectronic device, comprising:
a microelectronic die including an integrated circuit, an image sensor electrically coupled to the integrated circuit, and a plurality of bond-pads electrically coupled to the integrated circuit;
a cover over the image sensor, the cover including a first surface, a second surface opposite the first surface, and a plurality of interconnects extending from the first surface to the second surface, the interconnects being electrically coupled to corresponding bond-pads;
a substrate including an opening and a plurality of pads electrically coupled to corresponding interconnects, the cover being disposed between the substrate and the microelectronic die; and
an optics unit disposed at least partially within the opening and aligned with the image sensor.

41. The microelectronic device of claim 40 wherein the interconnects extend through the cover.

42. The microelectronic device of claim 40 wherein:
the cover further includes a plurality of ends connecting the first surface to the second surface; and
the individual interconnects wrap around one of the ends of the cover.

43. The microelectronic device of claim 40 wherein the interconnects are outboard the image sensor.

44. The microelectronic device of claim 40 wherein the interconnects are superimposed over the corresponding bond-pads.

* * * * *